United States Patent
Yao

(10) Patent No.: US 8,717,074 B2
(45) Date of Patent: May 6, 2014

(54) REFERENCE CLOCK COMPENSATION FOR FRACTIONAL-N PHASE LOCK LOOPS (PLLS)

(71) Applicant: Marvell World Trade Ltd., St. Michael (BB)

(72) Inventor: Chih-Wei Yao, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/050,911

(22) Filed: Oct. 10, 2013

(65) Prior Publication Data

US 2014/0035637 A1    Feb. 6, 2014

Related U.S. Application Data

(63) Continuation of application No. 13/364,185, filed on Feb. 1, 2012, now Pat. No. 8,564,342.

(60) Provisional application No. 61/439,784, filed on Feb. 4, 2011.

(51) Int. Cl.
*H03L 7/18* (2006.01)
*H03L 7/093* (2006.01)

(52) U.S. Cl.
USPC .......................................... 327/156; 327/147

(58) Field of Classification Search
CPC .......... H03L 7/0891; H03L 7/18; H03L 7/093
See application file for complete search history.

(56) References Cited

U.S. PATENT DOCUMENTS

| | | | |
|---|---|---|---|
| 5,640,523 A | 6/1997 | Williams | |
| 6,888,412 B2 * | 5/2005 | Kim et al. | 331/1 A |
| 7,015,738 B1 | 3/2006 | Cao | |
| 7,675,332 B1 * | 3/2010 | Kwasniewski et al. | 327/158 |
| 7,940,098 B1 * | 5/2011 | Kwasniewski et al. | 327/158 |
| 8,193,866 B2 * | 6/2012 | Chang | 331/1 A |
| 8,290,113 B2 * | 10/2012 | Marienborg et al. | 377/47 |
| 8,395,453 B2 * | 3/2013 | Chang et al. | 331/1 A |
| 8,429,487 B2 * | 4/2013 | Chang et al. | 714/752 |
| 2004/0263225 A1 * | 12/2004 | Perrott et al. | 327/156 |
| 2005/0141662 A1 | 6/2005 | Sano et al. | |
| 2005/0248413 A1 | 11/2005 | Zhu et al. | |
| 2008/0143398 A1 | 6/2008 | Fujiwara | |
| 2009/0021281 A1 | 1/2009 | Liu | |

(Continued)

OTHER PUBLICATIONS

"A 65nm Dual-Band 3-Stream 802.11n MIMO WLAN Soc," Abdollahi-Alibeik et al, 2011 IEE International Solid-State Circuits Conference, Digest of Technical Papers, ISSCC 2011, Feb. 22, 2011, pp. 170-171.

(Continued)

*Primary Examiner* — Adam Houston

(57) ABSTRACT

In one embodiment, a method includes determining a phase difference between a reference clock and a feedback clock in even and odd cycles for a phase lock loop (PLL). The even and odd cycles are alternating clock periods. A delta value based on the phase difference is determined. The method then adjusts a division value used by a divider to generate the feedback clock during the even cycle based on the delta value where the delta value is of a first polarity. Also, the method adjusts the division value used by the divider to generate the feedback clock during the odd cycle based on the delta value where the delta value is of a second polarity.

20 Claims, 8 Drawing Sheets

(56) References Cited

U.S. PATENT DOCUMENTS

| | | |
|---|---|---|
| 2009/0041173 A1 | 2/2009 | Lin |
| 2009/0096535 A1* | 4/2009 | Chang .............................. 331/17 |
| 2009/0096537 A1* | 4/2009 | Zhan et al. .................... 331/1 A |
| 2009/0096538 A1* | 4/2009 | Chang et al. .................. 331/1 A |
| 2009/0096539 A1* | 4/2009 | Chang et al. .................. 331/1 A |
| 2009/0097609 A1* | 4/2009 | Chang et al. .................. 375/376 |
| 2010/0277244 A1* | 11/2010 | Chang et al. .................... 331/16 |
| 2010/0315140 A1 | 12/2010 | Mayer et al. |
| 2011/0006938 A1* | 1/2011 | Ihs et al. ....................... 341/143 |
| 2011/0099450 A1* | 4/2011 | Chang et al. .................. 714/752 |
| 2012/0200328 A1* | 8/2012 | Yao ................................ 327/157 |
| 2012/0235714 A1* | 9/2012 | Marienborg et al. .......... 327/115 |
| 2013/0002317 A1* | 1/2013 | Frantzeskakis et al. ....... 327/156 |
| 2013/0136220 A1* | 5/2013 | Lee et al. ....................... 375/375 |
| 2013/0229212 A1* | 9/2013 | Dunworth et al. ............. 327/156 |

OTHER PUBLICATIONS

"Digital Reference Doubler Compensation," Yao, Chih-Wei, Marvell Reference Paper, Aug. 2, 2011, pp. 1-9.

International Search Report, PCT Application No. PCT/US2012/023535, mailed Apr. 2, 2012.

* cited by examiner

REFERENCE CLOCK COMPENSATION FOR FRACTIONAL-N PHASE LOCK LOOPS (PLLS)

CROSS REFERENCE TO RELATED APPLICATIONS

This application is a continuation of U.S. patent application Ser. No. 13/364,185, filed Feb. 1, 2012, now U.S. Pat. No. 8,564,342, which claims the benefit of priority under 35 U.S.C. §119(e) of commonly-assigned U.S. Provisional Application No. 61/439,784 (now expired), filed Feb. 4, 2011, each of which is incorporated herein by reference in its entirety for all purposes.

BACKGROUND

Unless otherwise indicated herein, the approaches described in this section are not prior art to the claims in this application and are not admitted to be prior art by inclusion in this section.

FIG. 1 depicts a reference clock doubler circuit 100 and FIG. 2 shows waveforms of the reference clock doubler circuit 100. A buffer 102 outputs a full-swing clock, $C_1$. A delay element 104 delays the full-swing clock $C_1$ and outputs a delayed full-swing clock $C_{2b}$. A logic element 106 (e.g., XOR gate) outputs a doubled reference clock $C_{2x}$. The rising edges of the doubled reference clock $C_{2x}$ comes from the rising and falling edges of the $C_1$ clock. The falling edges of the doubled reference clock $C_{2x}$ come from the rising and falling edges of the delayed full-swing clock $C_{2b}$. The non-50% duty cycle in clock signal $C_1$ causes a mismatch between the even clock period, $T_{ref,even}$, and odd clock period, $T_{ref,odd}$, in the doubled reference clock $C_{2x}$. For example, the mismatch causes high-reference spur. Additionally, a higher average "on time" is forced for charge pumps in a phase lock loop (PLL) using the doubled reference clock signal and also for time-to-digital converters (TDCs) for digital PLLs, which increases the phase noise due to the charge pump or TDC thermal and flicker noise.

FIG. 3 depicts a PLL 109 illustrating the reference doubler problem. A phase frequency detector (PFD) 110 receives a reference clock clkref (e.g., doubled reference clock $C_{2x}$) and a feedback clock clkfb. Phase frequency detector 110 outputs an up and down signal that represents the difference in phase between the two input signals. An up and down signal is output to a charge pump 112. Charge pump 112 charges capacitors C1 and C2 of a loop filter when an up switch 506-1 is closed and dissipates charge when a down switch 506-2 is closed. VCO 114 receives a tuning voltage from the loop filter and generates an oscillating signal with a frequency controlled by tuning voltage. A divider 116 divides the output of VCO 114 to generate the feedback signal clkfb.

At 117, a summary of the waveforms for signals received and output at PFD 110 is shown. At 118, reference clock clkref is shown; at 120, feedback clock clkfb is shown; at 122, an up signal is shown; and at 124, a down signal is shown. The even and odd cycles of reference clock clkref are not the same length. The up signal is generated by PFD 110 when a rising edge of reference clock clkref is before a rising edge of the feedback clock clkfb. The down signal is generated when the rising edge of the reference clock clkref is after a rising edge of the feedback clock clkfb. The up and down signals alternate every even and odd clock period.

The up and down signals deliver charge to capacitors C1 and C2 that cancel each other. However, uncorrelated noise may be received and increases in-band noise. For example, at 128, VCO 114 up-converts the noise received into reference spurs. One solution to correct the mismatch is to add digital and analog tuning to adjust the duty cycle of reference clock clkref. However, the analog tuning increases the noise. Also, digital tuning cannot track temperature variation without introducing large glitches to the output clock.

SUMMARY

In one embodiment, a method includes determining a phase difference between a reference clock and a feedback clock in even and odd cycles for a phase lock loop (PLL). The even and odd cycles are alternating clock periods. A delta value based on the phase difference is determined. The method then adjusts a division value used by a divider to generate the feedback clock during the even cycle based on the delta value where the delta value is of a first polarity. Also, the method adjusts the division value used by the divider to generate the feedback clock during the odd cycle based on the delta value where the delta value is of a second polarity.

In one embodiment, adjusting the division value includes: if the even cycle of the reference clock is longer than the odd cycle, adjusting the division value used by the divider to generate the feedback clock during the even cycle by a negative delta value and adjusting the division value used by the divider to generate the feedback clock during the odd cycle by a positive delta value and if the odd cycle of the reference clock is longer than the even cycle, adjusting the division value used by the divider to generate the feedback clock during the even cycle by the positive delta value and adjusting the division value used by the divider to generate the feedback clock during the odd cycle by the negative polarity.

In one embodiment, the method determines an average phase difference for the even and odd cycles, wherein the average phase difference is used to determine the delta value.

In one embodiment, the delta value of the first polarity and the delta value of the second polarity are alternatively applied to a sigma delta modulator configured to control the divider.

In one embodiment, an apparatus includes: circuitry configured to determine a phase difference between a reference clock and a feedback clock in even and odd cycles for a phase lock loop (PLL), the even and odd cycles being alternating clock periods; circuitry configured to determine a delta value based on the phase difference; circuitry configured to adjust a division value used by a divider to generate the feedback clock during the even cycle based on the delta value, wherein the delta value is of a first polarity; and circuitry configured to adjust the division value used by the divider to generate the feedback clock during the odd cycle based on the delta value, wherein the delta value is of a second polarity.

The following detailed description and accompanying drawings provide a more detailed understanding of the nature and advantages of the present invention.

DETAILED DESCRIPTION

Described herein are techniques for a PLL. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
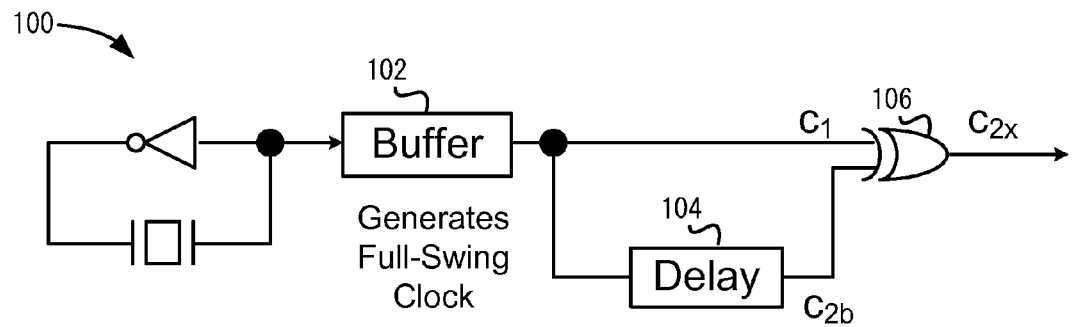
FIG. 1 depicts a reference clock doubler circuit.
Figure 2:
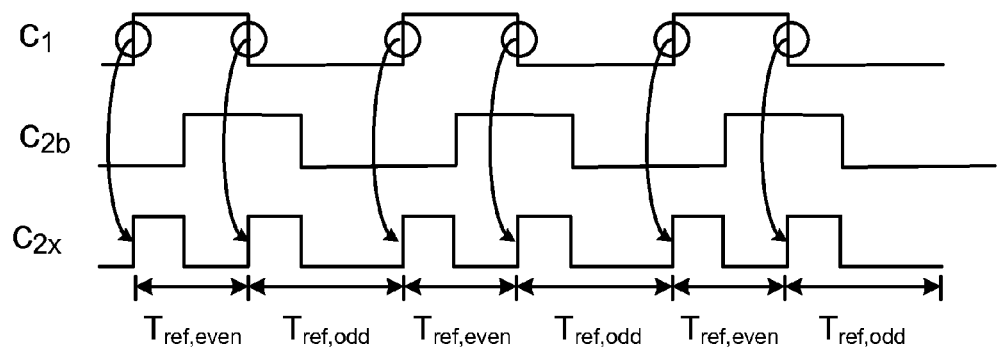
FIG. 2 shows waveforms of the reference clock doubler circuit.
Figure 3:
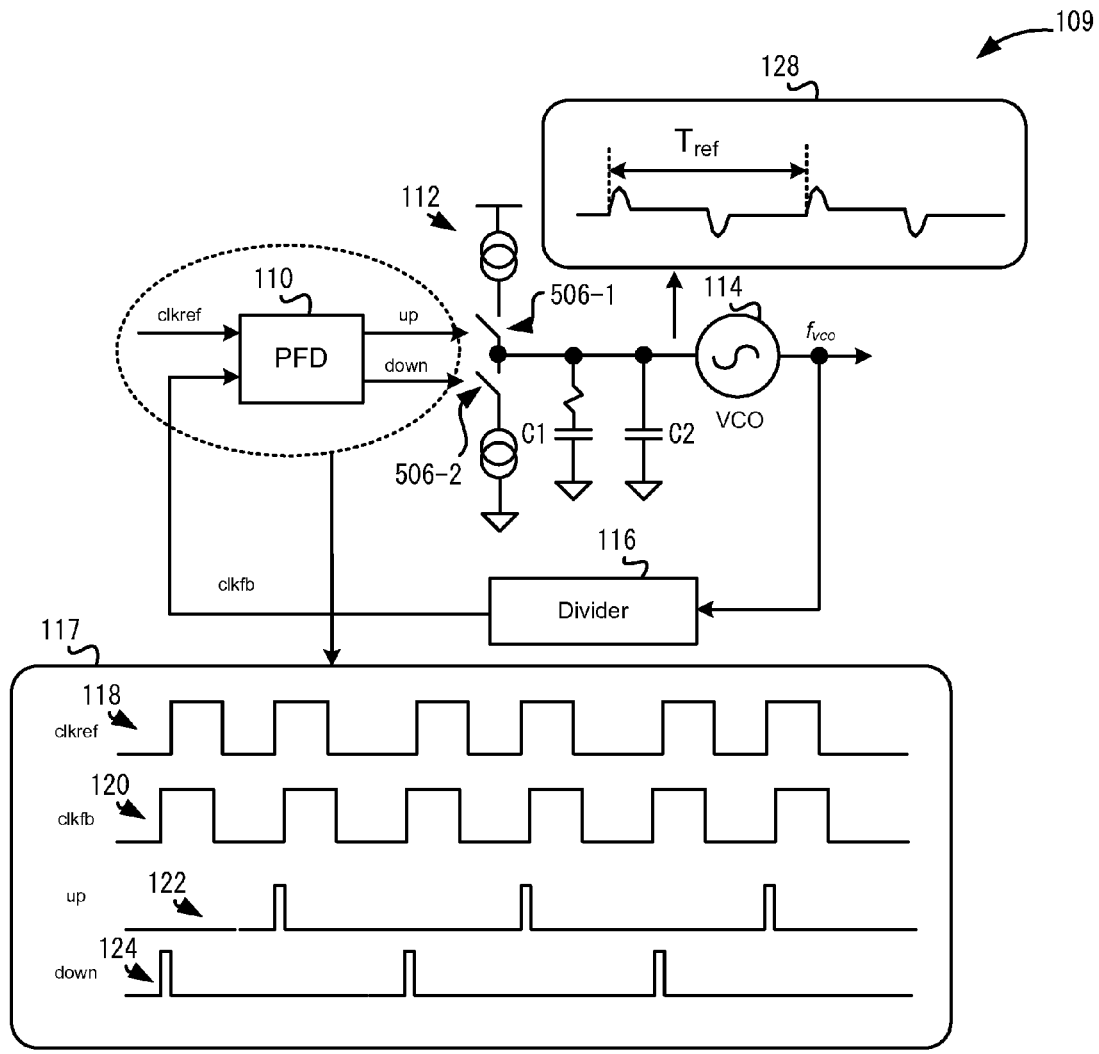
FIG. 3 depicts a PLL illustrating the reference doubler problem.
Figure 4:
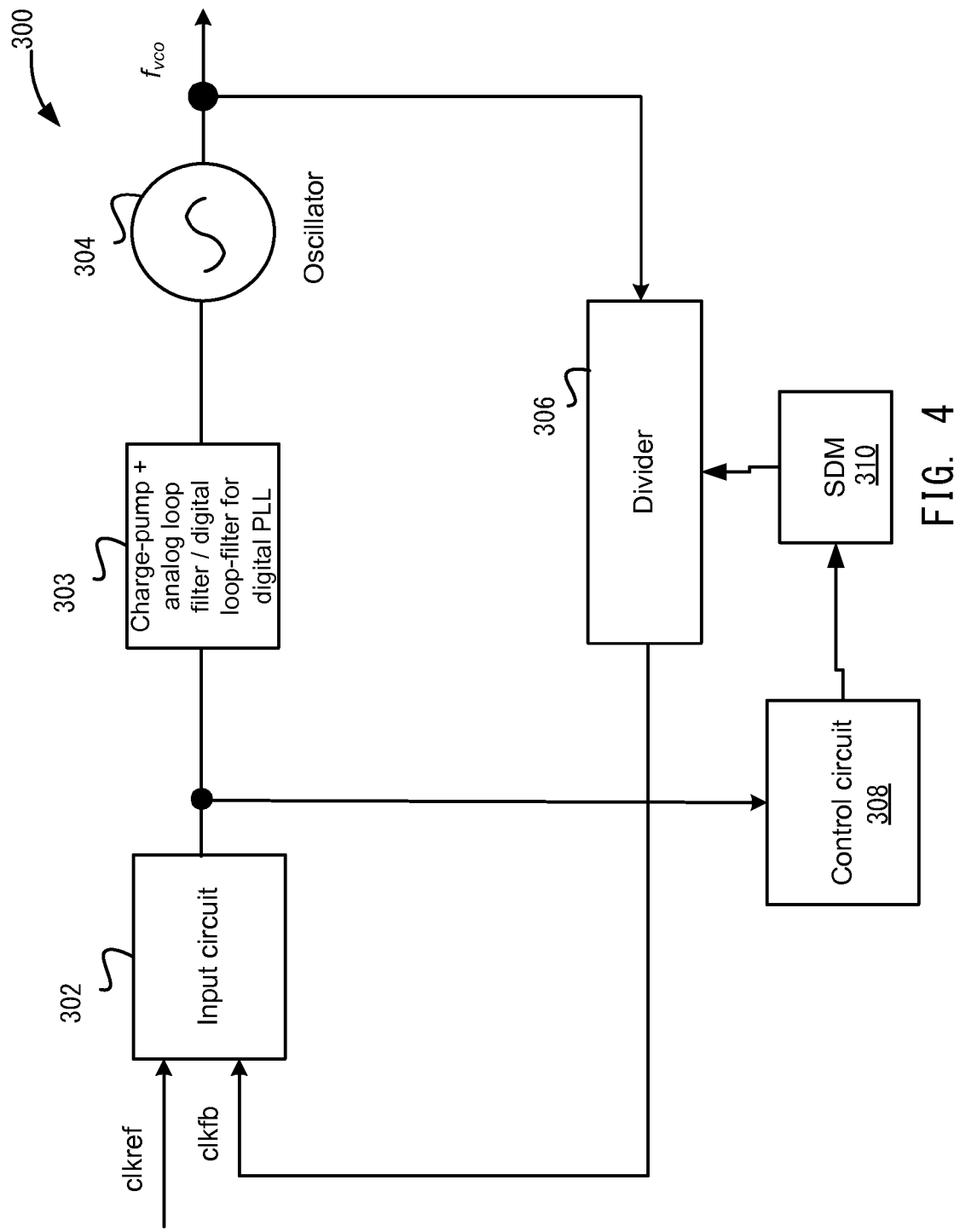
FIG. 4 depicts an example of a phase lock loop according to one embodiment.

FIG. 4 depicts an example of a phase lock loop 300 according to one embodiment. PLL 300 may be an analog or digital version of a PLL. Different examples of analog and digital PLLs are described below. An input circuit 302 receives a reference clock clkref and a feedback clock clkfb. The reference clock clkref may not be a doubled reference clock with a 50% duty cycle. Input circuit 302 compares reference clock clkref and feedback clock clkfb, and produces an error signal that is proportional to the phase difference. The error signal is passed through a charge pump driving an analog loop-filter (analog circuit) or a digital loop filter (digital circuit) 303 to an oscillator 304. Oscillator 304 may be a digitally controlled oscillator (DCO) or a voltage controlled oscillator (VCO). Oscillator 304 outputs an oscillating signal $f_{vco}$ that is driven by the error signal.

A divider 306 is configured to divide the output of oscillator 304 by a division value of the reference frequency. Divider 306 may be a fractional N divider. With a modulus controller, N is toggled among multiple values so that oscillator 304 generates a frequency that is time-averaged N multiple of the reference frequency. This divides the output of oscillator 304 to adjust the frequency of the feedback clock clkfb. Particular embodiments use a control circuit 308 to control a sigma delta modulator (SDM) 310 that changes the division value that is used to divide the output of oscillator 304 at divider 306. Changing the division value that is used to divide the output of oscillator 304 to generate the feedback signal clkfb is used to correct the reference clock clkref, which may have a different even/odd clock period. Using different division values can better align the feedback clock clkfb to the reference clock signal clkref. The feedback signal clkfb may be aligned to the desired even and odd reference clock edges. Also, the reference clock clkref does not need to be altered, which lowers the noise introduced by a reference doubler with duty cycle correction. The altering of the division value also can track processing and temperature variations since the division value is changed based on waveforms detected by control circuit 308.

Figure 5:
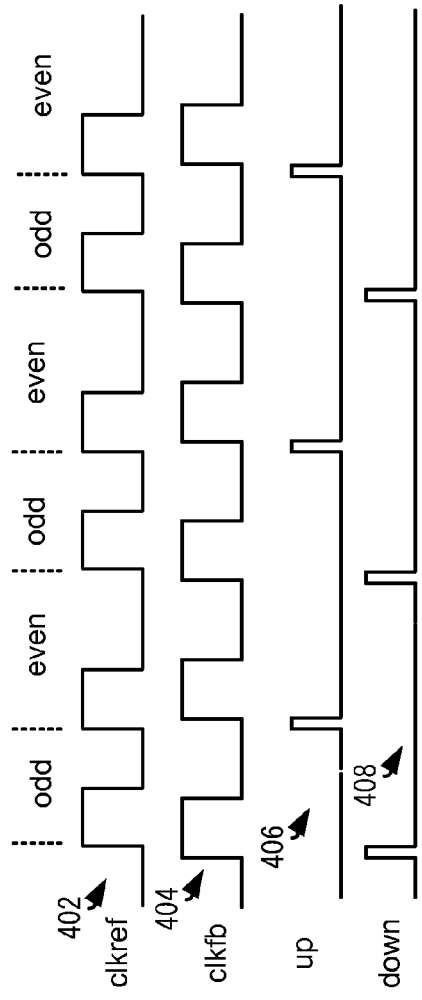
FIG. 5 shows an example of waveforms for the PLL according to one embodiment.
Figure 5:
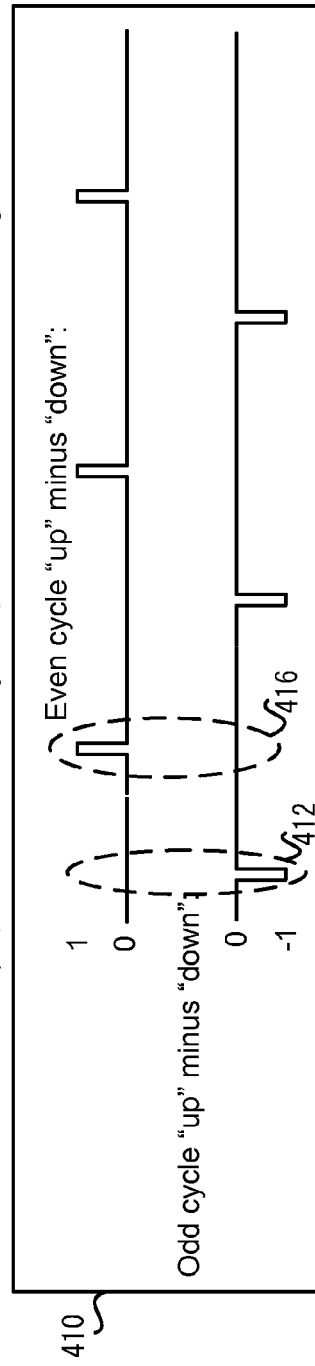
Figure 5:
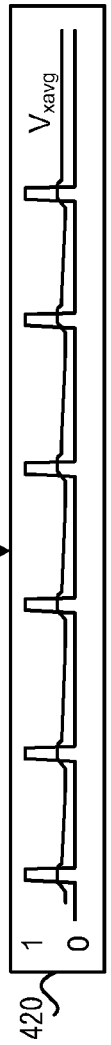

FIG. 5 shows an example of waveforms for PLL 300 according to one embodiment. At 402, reference clock clkref is shown; at 404, feedback clock clkfb is shown; at 406, an up signal is shown; and at 408, a down signal is shown. The even and odd cycles of reference clock clkref are not the same length. The up signal is generated by input circuit 302 when a rising edge of reference clock clkref is before a rising edge of the feedback clock clkfb. The down signal is generated when the rising edge of the reference clock clkref is after a rising edge of the feedback clock clkfb. The up and down signals alternate every even and odd clock period.

Control circuit 308 determines an adjustment to the division value based on the up and down signals. For example, at 410, two calculations are shown for the even cycle and the odd cycle. At 412, the even cycle up signal is subtracted from the down signal. For example, at 412, the odd cycle up value is "0" and the odd cycle down is "−1", which yields 0−−1=1. At 414, the odd cycle up is subtracted from the down signal. For example, the even cycle up is "1" and the even cycle down is "0", which yields 1−0=1. The result of the calculations is shown at 420.

At 420, the difference is shown and an average $V_{xavg}$ is determined via a low pass filter. The average $V_{xavg}$ is used to determine the division value of divider 306. For example, if the average $V_{xavg}$ is positive, then even cycle period $T_{even}$>odd cycle period $T_{odd}$. That is, the period of the even cycle ($T_{even}$) is longer than the period of the odd cycle ($T_{odd}$) for the reference clock clkref. To make the feedback clock clkfb more aligned with the reference clock clkref, the period of the even cycle is decreased and the period of the odd cycle is increased for the feedback clock. If the average $V_{xavg}$ is negative, then $T_{even}$<$T_{odd}$. That is, the odd cycle is longer than the even cycle in the reference clock clkref. To make the feedback clock clkfb more aligned with the reference clock clkref, the period of the odd cycle is decreased and the period of the even cycle is increased for the feedback clock. The clock period is reduced if a smaller divider value is used and the clock period is increased if a larger division value is used. Particular embodiments determine a delta value Δ for the even and odd cycles to apply to SDM 310 to adjust the multiplier used by divider 316. The delta value may be a value to change the multiplier used. Additionally, different polarities for the delta value may be applied to the even and odd cycles. For example, a −2 delta value is applied to the even cycle and a +2 delta value is applied to the odd cycle. This reduces the period of the even cycle and increases the period of the odd cycle.

Figure 6:
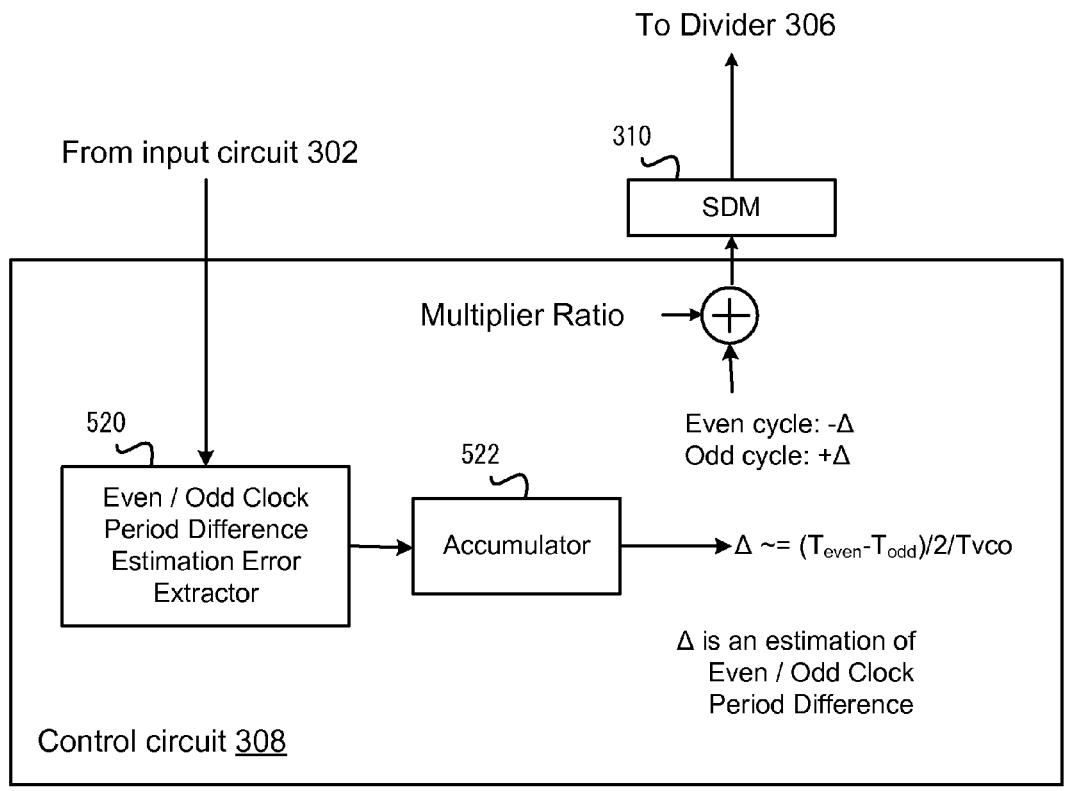
FIG. 6 shows a more detailed example of a control circuit according to one embodiment.

FIG. 6 shows a more detailed example of control circuit 308 according to one embodiment. An even/odd clock period difference estimation error extractor 520 determines the phase difference in the even cycle and odd cycle. For example, the output of even/odd clock period difference estimation error extractor 520 is shown in 420 of FIG. 5. An accumulator 522 then accumulates the differences and determines average $V_{xavg}$ as shown in 420 of FIG. 5. Accumulator 522 outputs a delta value Δ, which is an estimation of the even/odd clock period difference. The delta value may be a negative delta value and a positive delta value that are alternatively applied, such as the negative delta value is applied to the odd cycle and then the positive delta value is applied to the even cycle. The negative delta value reduces the division value used in divider 306, which reduces the period, and the positive delta value increases the division value used in divider 306, which increases the period. The delta value is added with a multiplier ratio and input into SDM 310. The positive delta value and the negative delta value are alternated in a sequence in the even and odd cycles to correct the feedback clock clkfb.

For the example shown in FIG. 5, for the odd clock period, the division value used in divider 306 is increased to increase the odd clock period and the division value used in divider 306 during the even clock period is decreased to decrease the even clock period. This aligns the feedback signal clkfb with the reference signal clkref.

The input to SDM 310 is the delta values for the even and odd cycles. SDM 310 uses a delta-sigma transfer function. The output of SDM 310 may be the sum of the following terms: a sequence delta values with alternating polarity (+delta, −delta, +delta, −delta, ...), PLL multiplication value, and quantization noise. The output is a division sequence (e.g., integer division sequence) for divider 316 that reflects the delta values input while shifting the quantization noise to higher frequencies that can be removed by the loop-filter. Particular embodiments may implement a digital solution that results in no analog noise and also tracks processing variations.

Figure 7:
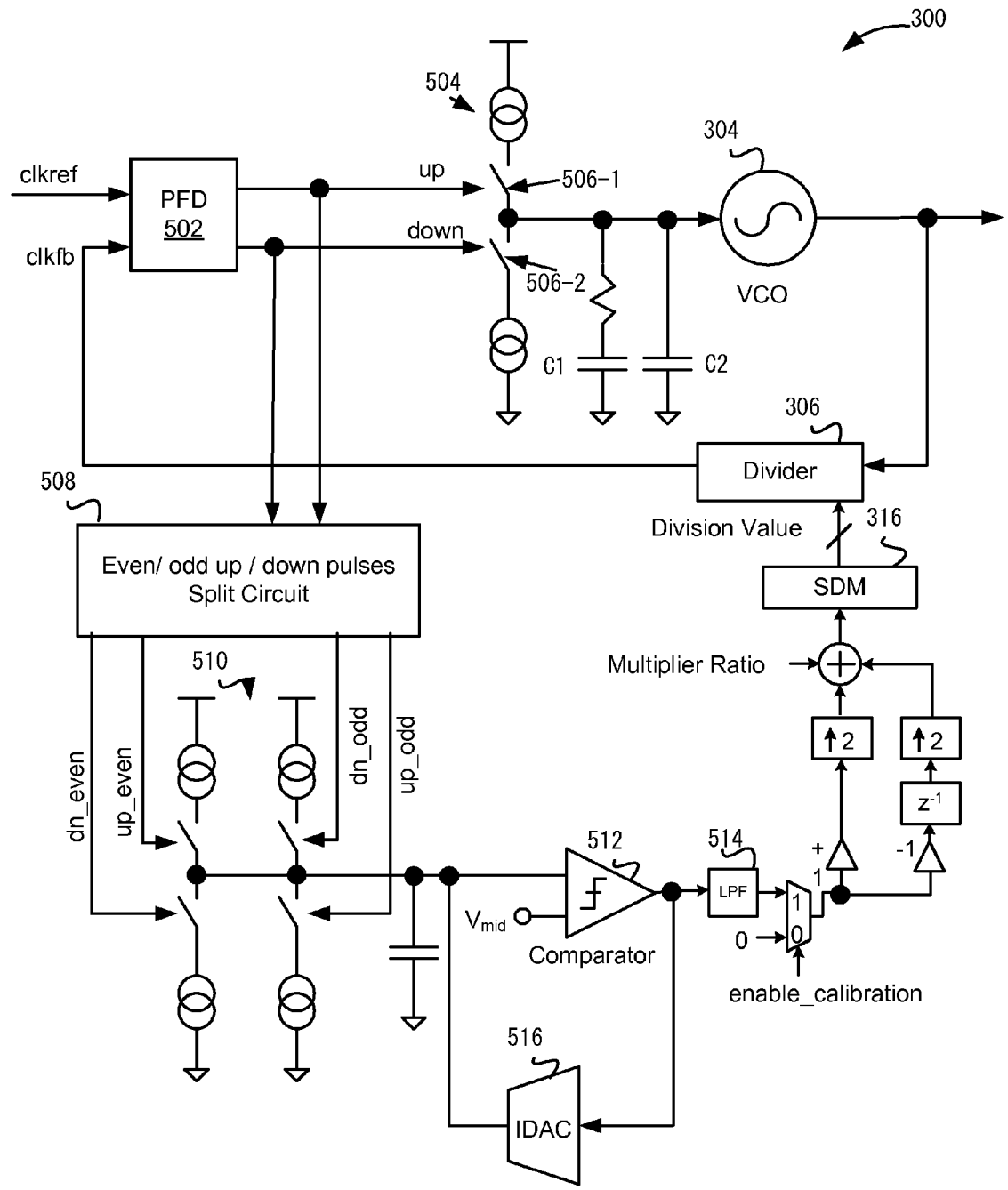
FIG. 7 depicts an example of a control circuit in an analog PLL according to one embodiment.

Different implementations for PLL 300 are provided according to particular embodiments. FIG. 7 depicts an example of control circuit 308 in an analog PLL 300 using charge pumps according to one embodiment. A phase frequency detector (PFD) 502 receives a reference clock clkref and a feedback clock clkfb. An up and down signal is output to a charge pump 504. Charge pump 504 charges capacitors C1 and C2 when an up switch 506-1 is closed and dissipates charge when a down switch 506-2 is closed. A voltage controlled oscillator (VCO) 507 generates an oscillating signal.

An even/odd up/down pulses split circuit 508 receives the up and down signals from PFD 502 and splits the even/odd signals into an dn_even signal, an up_even signal, a dn_odd signal, and an up_odd signal. The signals are input into charge pumps 510 to detect the phase error difference in the even and odd cycles for the reference clock and the feedback clock. A comparator 512 (or a delta-sigma analog to digital converter (ADC)) is used to convert the phase-error difference in the even and odd cycles to digital values. A current digital to analog (IDAC) 516 is used to convert digital values back into analog values for input back into the comparator. A low pass filter 514 determines the average phase error $V_{xavg}$ and cleans up high frequency divider SDM 316 activities and noise. Thus, low pass filter 514 outputs an estimate of the relative difference in the even and odd cycles. A multiplexer 516 is used to apply alternating polarity to the estimated phase difference in the even and odd cycles, and the result is added and input to SDM 316. The result is a positive delta value +Δ value and a negative delta value −Δ to input into SDM 310, which changes the division value of divider 306 for the even and odd clock periods. Thus, a negative feedback loop is formed to cancel the difference of average phase error between the even and odd samples.

Figure 8:
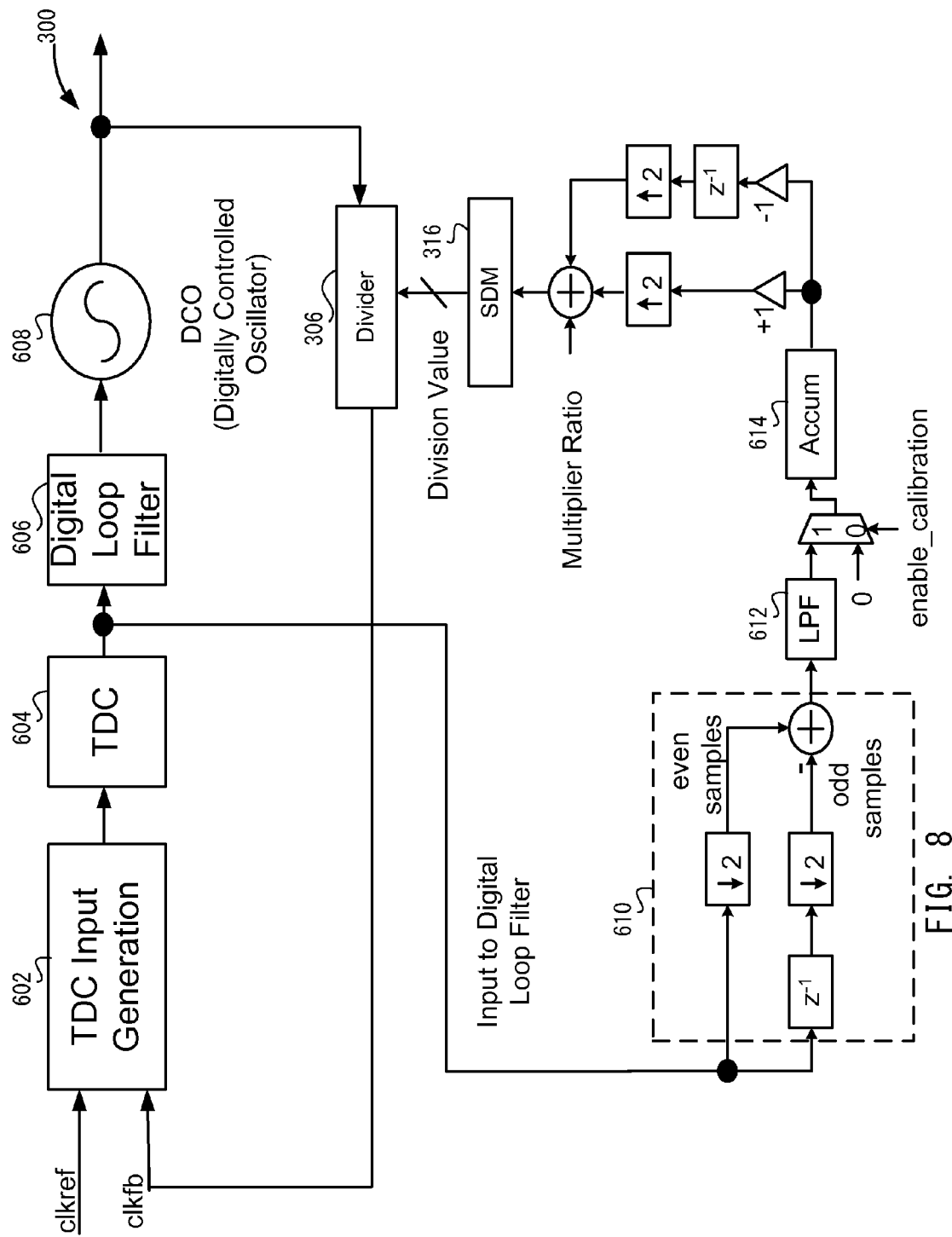
FIG. 8 depicts an example of a control circuit in a digital PLL according to one embodiment.

FIG. 8 depicts an example of control circuit 308 in a digital PLL 300 according to one embodiment. A time to digital converter (TDC) input generation block 602 receives the reference clock clkref and the feedback clock clkfb and outputs timing information for the phase difference in the reference clock and the feedback clock for even and odd cycles. The output of block 602 is input into TDC 604, which converts timing information to digital codes. The timing information can be carried as a pulse width modulated signal or the timing difference between the rising or falling edges of two input clocks. A digital loop filter 606 filters the signal and generate a frequency control signal to drive the digitally controlled oscillator (DCO) 608, which outputs an oscillating signal.

For control circuit 308, a circuit 610 receives phase error difference information that is already in digital form and separates the phase error difference in the even and odd cycles. A low pass filter 612 determines the average phase error $V_{xavg}$ and cleans up high frequency divider SDM 316 activities and noise. Thus, low pass filter 612 outputs an estimate of the relative phase difference in the even and odd reference clock periods. An accumulator 614 is used to apply alternating polarity to the estimated phase difference in the even and odd clock periods, and the result is added and input to SDM 316. The result is a positive delta value +Δ value and negative delta value −Δ to input into SDM 316, which changes the division value of divider 306.

Figure 9:
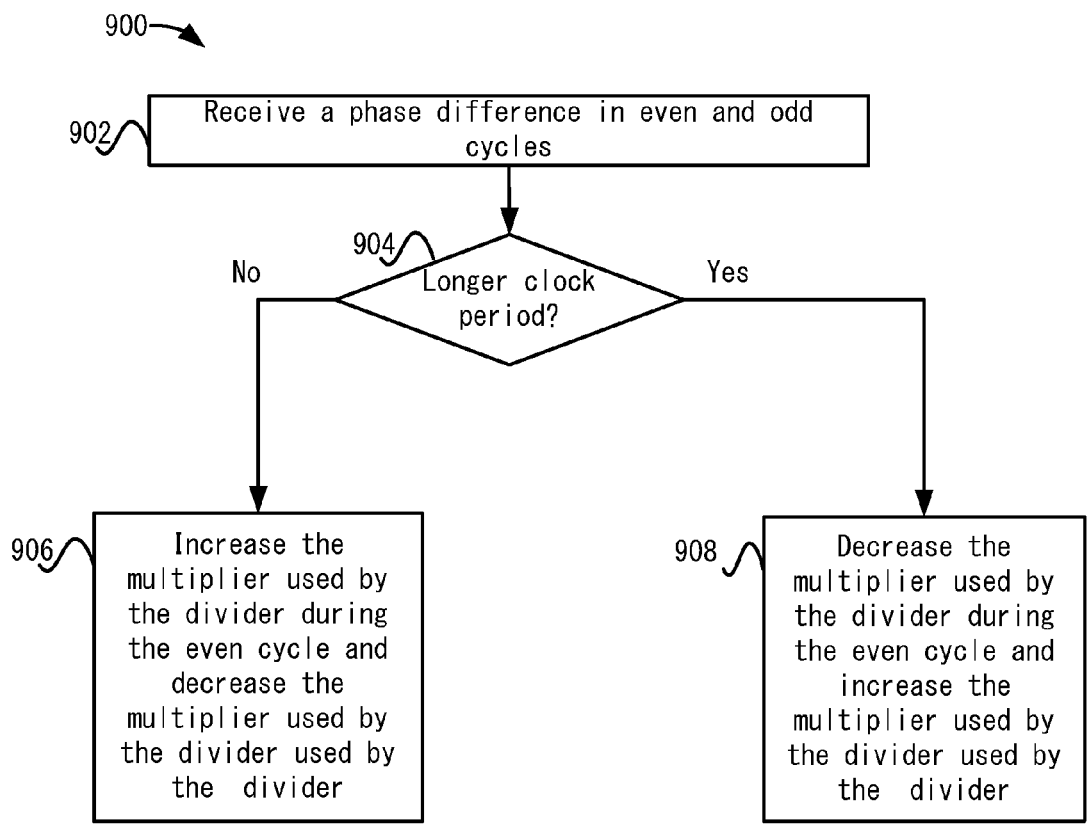
FIG. 9 depicts a simplified flowchart of a method for determining a divider value according to one embodiment.

FIG. 9 depicts a simplified flowchart 900 of a method for determining a divider value according to one embodiment. At 902, control circuit 308 receives a phase difference in even and odd cycles. At 904, control circuit 308 determines if the phase difference indicates the even cycle has a shorter clock period or a longer clock period than the odd cycle. If the even cycle has a shorter clock period than desired, then control circuit 308 increases the multiplier used by divider 316 during the even cycle and decreases the multiplier used by divider 316 used by divider 316 at 906. If the even cycle has a longer clock period than desired, then control circuit 308 decreases the multiplier used by divider 316 during the even cycle and increases the multiplier used by divider 316 used by divider 316 at 906.

Accordingly, a reference spur is reduced due to the equal averaged phase error for even and odd clock cycles after compensation. Additionally, the presented compensation technique tracks temperature variations, and such tracking capability is difficult to realize with reference doubler duty cycle compensation circuits.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A method comprising:
   estimating a first parameter based on a phase difference between a first clock and a second clock in a first plurality of cycles and a second plurality of cycles;
   adjusting a second parameter used to generate the second clock during the first plurality of cycles based on a first polarity of the first parameter; and
   adjusting the second parameter used to generate the second clock during the second plurality of cycles based on a second polarity of the first parameter.

2. The method of claim 1, wherein the first plurality of cycles are even cycles, the second plurality of cycles are odd cycles, and the even cycles and the odd cycles are alternating clock periods.

3. The method of claim 1, wherein the first clock is a reference clock for a phase lock loop (PLL) and the second clock is a feedback clock for the PLL.

4. The method of claim 1, wherein the first plurality of cycles in the first clock has a different clock period than the second plurality of cycles in the first clock.

5. The method of claim 1, wherein the first parameter is a delta value that is an estimate of a period difference between the first plurality of cycles of the first clock and the second plurality of cycles of the first clock.

6. The method of claim 1, wherein the second parameter is a division value used to generate the second clock, and wherein the division value that is used to generate the second clock during the first plurality of cycles is different from the division value that is used to generate the second clock during the second plurality of cycles.

7. The method of claim 1, wherein the adjusting the second parameter used to generate the second clock during the first plurality of cycles based on the first polarity of the first parameter comprises:
   increasing a period of the first plurality of cycles of the second clock when the first plurality of cycles of the first clock are on average longer than the second plurality of cycles of the first clock; and
   decreasing the period of the first plurality of cycles of the second clock when the second plurality of cycles of the first clock are on average longer than the first plurality of cycles of the first clock.

8. The method of claim 1, wherein the adjusting the second parameter used to generate the second clock during the second plurality of cycles based on the second polarity of the first parameter comprises:
   increasing a period of the second plurality of cycles of the second clock when the second plurality of cycles of the first clock are on average longer than the first plurality of cycles of the first clock; and
   decreasing the period of the second plurality of cycles of the second clock when the first plurality of cycles of the first clock are on average longer than the second plurality of cycles of the first clock.

9. The method of claim 1, wherein the second parameter is adjusted to align the second clock to the first clock, and the first clock is unchanged.

10. The method of claim 1, further comprising determining the phase difference by subtracting an up signal from a down signal, the up signal being generated when a rising edge of the first clock occurs before a rising edge of the second clock, and the down signal being generated when a rising edge of the first clock occurs after a rising edge of the second clock.

11. A system comprising circuitry configured to:
   estimate a first parameter based on a phase difference between a first clock and a second clock in a first plurality of cycles and a second plurality of cycles;
   adjust a second parameter used to generate the second clock during the first plurality of cycles based on a first polarity of the first parameter; and
   adjust the second parameter used to generate the second clock during the second plurality of cycles based on a second polarity of the first parameter.

12. The system of claim 11, wherein the first plurality of cycles are even cycles, the second plurality of cycles are odd cycles, and the even cycles and the odd cycles are alternating clock periods.

13. The system of claim 11, wherein the first clock is a reference clock for a phase lock loop (PLL) and the second clock is a feedback clock for the PLL.

14. The system of claim 11, wherein the first plurality of cycles in the first clock has a different clock period than the second plurality of cycles in the first clock.

15. The system of claim 11, wherein the first parameter is a delta value that is an estimate of a period difference between the first plurality of cycles of the first clock and the second plurality of cycles of the first clock.

16. The system of claim 11, wherein the second parameter is a division value used to generate the second clock, and wherein the division value that is used to generate the second clock during the first plurality of cycles is different from the division value that is used to generate the second clock during the second plurality of cycles.

17. The system of claim 11, wherein the circuitry adjusts the second parameter used to generate the second clock during the first plurality of cycles based on the first polarity of the first parameter by:
   increasing a period of the first plurality of cycles of the second clock when the first plurality of cycles of the first clock are on average longer than the second plurality of cycles of the first clock; and
   decreasing the period of the first plurality of cycles of the second clock when the second plurality of cycles of the first clock are on average longer than the first plurality of cycles of the first clock.

18. The system of claim 11, wherein the circuitry adjusts the second parameter used to generate the second clock during the second plurality of cycles based on the second polarity of the first parameter by:
   increasing a period of the second plurality of cycles of the second clock when the second plurality of cycles of the first clock are on average longer than the first plurality of cycles of the first clock; and
   decreasing the period of the second plurality of cycles of the second clock when the first plurality of cycles of the first clock are on average longer than the second plurality of cycles of the first clock.

19. The system of claim 11, wherein the second parameter is adjusted to align the second clock to the first clock, and the first clock is unchanged.

20. The system of claim 11, wherein the circuitry is further configured to determine the phase difference by subtracting an up signal from a down signal, the up signal being generated when a rising edge of the first clock occurs before a rising edge of the second clock, and the down signal being generated when a rising edge of the first clock occurs after a rising edge of the second clock.

* * * * *